(12) United States Patent
Boudreaux et al.

(10) Patent No.: US 7,345,885 B2
(45) Date of Patent: Mar. 18, 2008

(54) HEAT SPREADER WITH MULTIPLE STACKED PRINTED CIRCUIT BOARDS

(75) Inventors: Brent A. Boudreaux, Highland Village, TX (US); Shaun L Harris, McKinney, TX (US); Eric C. Peterson, McKinney, TX (US); Christian L Belady, McKinney, TX (US); Gary W. Williams, Rowlett, TX (US); Stuart C. Haden, Lucas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 356 days.

(21) Appl. No.: 11/023,213

(22) Filed: Dec. 22, 2004

(65) Prior Publication Data

US 2006/0133043 A1    Jun. 22, 2006

(51) Int. Cl.
*H05K 7/20* (2006.01)
*H01L 23/34* (2006.01)
*F28F 7/00* (2006.01)

(52) U.S. Cl. ............... 361/721; 257/706; 257/707; 257/712; 257/713; 361/704; 361/710; 361/715; 361/719; 165/80.3; 165/185

(58) Field of Classification Search ............... 361/707, 361/715, 719–721
See application file for complete search history.

(56) References Cited

U.S. PATENT DOCUMENTS

| 4,563,725 | A | * | 1/1986 | Kirby ................... 361/708 |
| 4,716,498 | A | * | 12/1987 | Ellis ................... 361/715 |
| 4,884,168 | A | * | 11/1989 | August et al. ........... 361/702 |
| 5,014,904 | A | * | 5/1991 | Morton ................... 228/176 |
| 5,768,104 | A | * | 6/1998 | Salmonson et al. ....... 361/704 |
| 5,969,950 | A | * | 10/1999 | Tantoush ................ 361/704 |
| 6,180,436 | B1 | * | 1/2001 | Koors et al. ........... 438/117 |
| 6,269,866 | B1 | * | 8/2001 | Yamamoto et al. ..... 165/104.26 |
| 6,771,507 | B1 | | 8/2004 | Belady et al. |
| 6,775,153 | B2 | * | 8/2004 | Hashimoto ............. 361/803 |
| 6,816,378 | B1 | | 11/2004 | Belady et al. |
| 7,002,805 | B2 | * | 2/2006 | Lee et al. ............. 361/704 |
| 7,045,395 | B2 | * | 5/2006 | Lo et al. ............... 438/122 |
| 2006/0133042 | A1 | * | 6/2006 | Belady et al. .......... 361/704 |

* cited by examiner

*Primary Examiner*—Gregory D Thompson (57) ABSTRACT

A heat spreader with multiple stacked printed circuit boards (PCBS) includes top and side sections within which a first PCB is contained and bottom edges that extend to a second PCB. The heat spreader and second PCB substantially enclose the first PCB therein.

18 Claims, 6 Drawing Sheets

HEAT SPREADER WITH MULTIPLE STACKED PRINTED CIRCUIT BOARDS

BACKGROUND

Electronic printed circuit boards (PCBs) commonly have a board with electronic components mounted thereon that can generate a considerable amount of heat due to electrical power consumption. The heat must be dissipated from the components and the board to ensure proper functioning of the components and to prevent damage to any part of the PCB.

A variety of techniques have been developed to dissipate the heat. For instance, one low-cost technique simply allows the source of the heat to transfer the heat by convection to ambient air. However, this technique has a relatively low effectiveness. To enhance the effectiveness of dissipation by convection, a fan is added to force the air to flow over the component. A heat sink or heat spreader may be attached to the component to further enhance heat dissipation by conducting the heat away from the heat source to a surface area (larger than that of the component) from which the heat may be dissipated to the air. For even greater heat dissipation enhancement, increasingly sophisticated techniques have been developed, including the use of heat pipes, active refrigeration, liquid cooled plates and spray cooling. Each such enhancement, however, is offset by an added cost.

It has been necessary to accept the added cost for enhanced heat dissipation techniques because a significant trend in the electronics industry has been to continually increase the processing power and power consumption of electronic components, leading to increasingly greater needs for heat dissipation. An additional trend, however, has been to decrease the size of the components, resulting in greater heat dissipation requirements in smaller volumes. In addition to decreasing the size of the individual components, such components are also often closely packed together in PCBs or circuit board modules, leaving little room between components to place the often-bulky heat dissipation apparatus. Furthermore, multiple PCBs in a single circuit board module may be closely stacked one on top of the other, leaving little or no room between the PCBs for the heat dissipation apparatus, even though the technique of flowing air between the stacked PCBs is insufficient to adequately cool the components therein.

DETAILED DESCRIPTION

Figure 1:
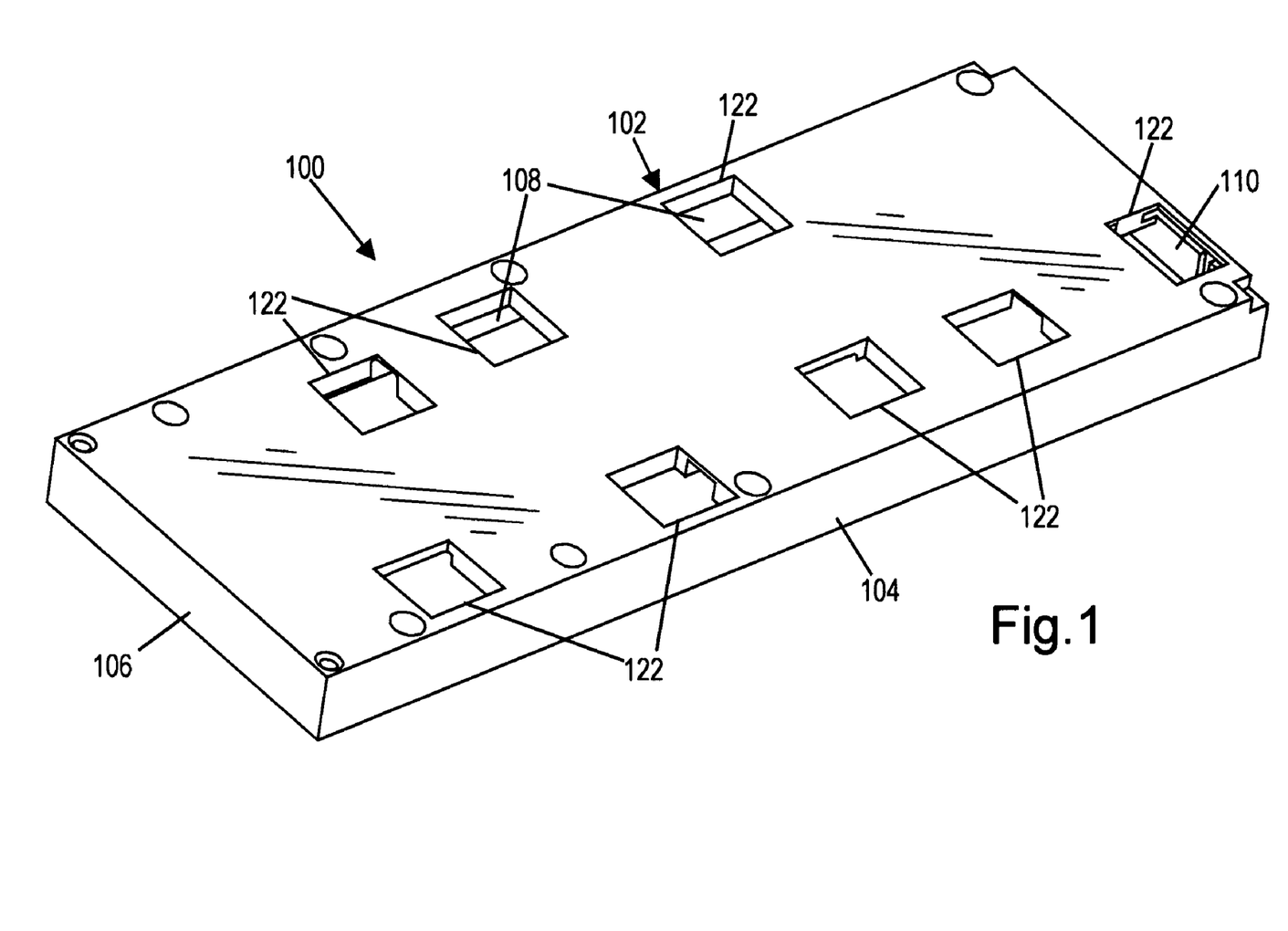
FIG. 1 is a top, front, left side perspective view of a heat spreader according to an embodiment of the present invention.
Figure 2:
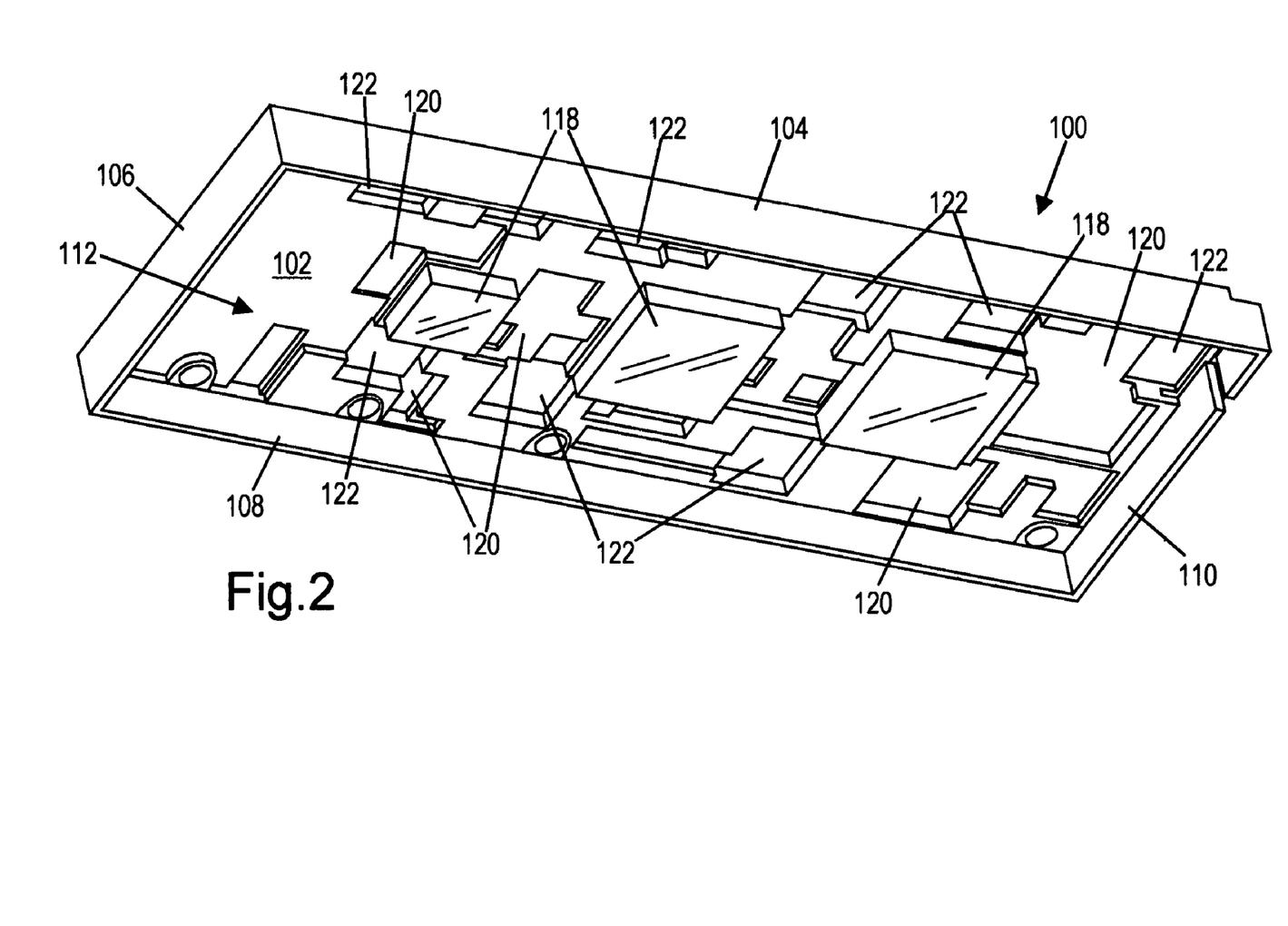
FIG. 2 is a bottom, front, left side perspective view of the heat spreader shown in FIG. 1 according to an embodiment of the present invention.
Figure 3:
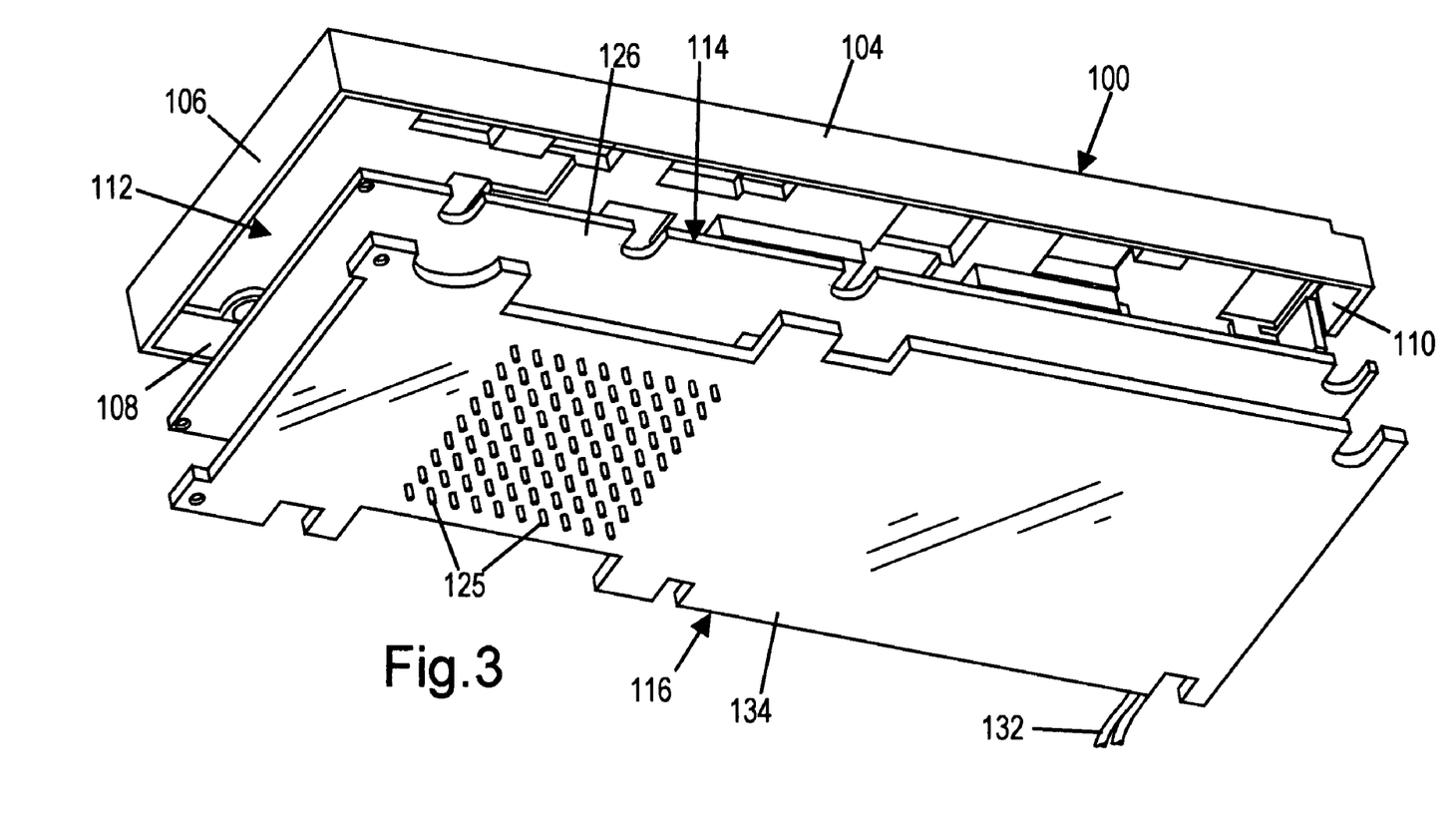
FIG. 3 is a bottom, front, left side perspective view of the heat spreader shown in FIG. 1 with multiple printed circuit boards according to an embodiment of the present invention.

An exemplary heat spreader 100, as shown in FIGS. 1 and 2, incorporating an embodiment of the present invention generally includes a top section 102 and side sections 104, 106,108 and 110. The heat spreader 100 is made of an appropriate high-thermal-conductivity material, and in some embodiments the material is also electrically conductive. The top section 102 and side sections 104-110 define an interior 112 of the heat spreader 100. One or more exemplary printed circuit boards (PCBs)(e.g. PCBs 114 and 116 shown in exploded relationship with the heat spreader 100 in FIG. 3) may be connected to the heat spreader 100 within and/or adjacent to the interior 112, as described below. Although the present invention is described with respect to having two PCBs 114 and 116, it is understood that the invention is not so limited, but may include any number of PCBs in stacked and/or side-by-side relationship (See FIG. 6). According to the illustrated example of an embodiment of the present invention, the heat spreader 100 dissipates heat from the PCBs 114 and 116 and components (e.g. processors, power regulators, other integrated circuits, etc.) mounted on the PCBs 114 and 116. In this manner, the heat generated by the components on the PCBs 114 and 116 is transferred to a single shared/common heat dissipation device (the heat spreader 100) for efficient transfer away from the heat sources and for enabling a denser packing of the PCBs 114 and 116 and the components on the PCBs 114 and 116 than is enabled by the techniques described in the background. If such background heat dissipation techniques were attempted to be used with the PCBs 114 and 116, when the components are placed in relatively close arrangement and the PCBs 114 and 116 are stacked together in a relatively tight circuit board module, there would be little or no room for each individual heat dissipation device.

An additional benefit of some embodiments of the heat spreader 100 is that the heat spreader 100 can also serve to suppress electromagnetic interference (EMI) generated by the components during operation of the PCBs 114 and 116, since the heat spreader 100 generally completely surrounds the PCBs 114 and 116 and at least some of the components thereon, as shown below, and since the heat spreader 100 is electrically conductive in some embodiments. In this embodiment, the heat spreader 100 is grounded to the PCBs 114 and/or 116. The heat dissipation devices described in the background, on the other hand, are insufficient to suppress EMI, since such devices do not sufficiently surround the components and PCBs to which they are attached.

According to various embodiments, the interior side of the top section 102 is generally shaped or formed with a variety of features, such as, for example, projections/protrusions 118, recesses/cavities 120 and/or holes/openings 122. The size, shape and placement of the various features 118-122 are at least partly dependent on the size, shape and placement of the components on the PCBs 114 and 116 to which the heat spreader 100 may be attached, as described below. Each feature 118-122 generally corresponds to one or more of the components on the PCBs 114 and 116. At least some of these components generally have heat dissipation requirements that cannot be satisfied by the techniques described in the background due to physical constraints in the layout of the components and the PCBs 114 and 116. The heat spreader 100, however, can satisfy the heat dissipation requirements of the components on the PCBs 114 and 116 because the heat spreader 100 contacts (or is in thermal conductive relationship with) these components due to the size, shape and placement of the various features 118-122.

The heat spreader 100 generally conducts the heat generated by these components to the outer surfaces of the sections 102-110 where the heat can be dissipated to ambient air or can be further transferred away by a heat sink, heat pipe, cooling plate or other appropriate heat dissipation means. According to some embodiments, therefore, such heat dissipation means may be attached to the outer surface of the top section 102 or side sections 104-110.

Figure 4:
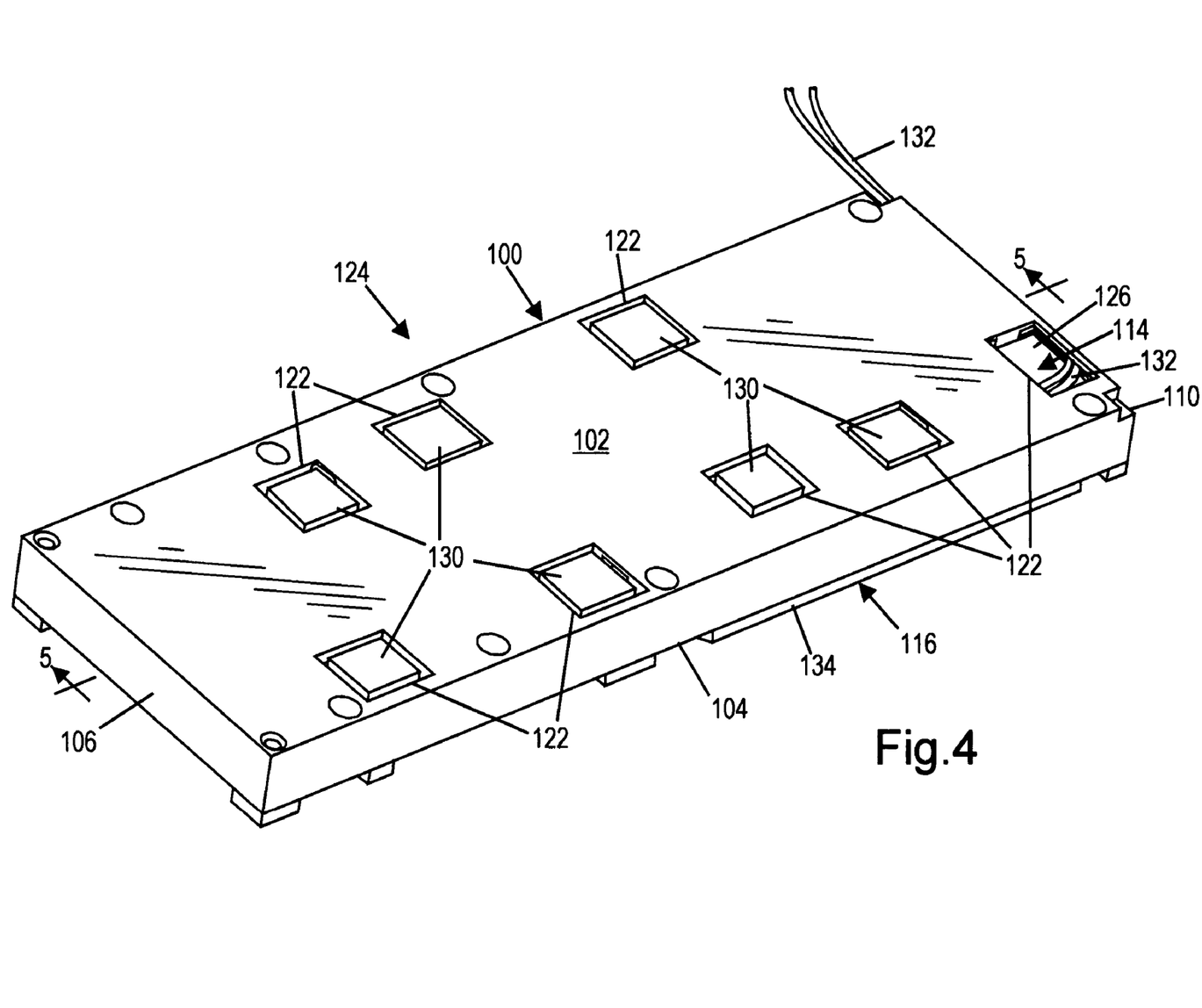
FIG. 4 is a top, front, left side perspective view of a circuit board module having the heat spreader and multiple printed circuit boards shown in FIG. 3 according to an embodiment of the present invention.

Upon being attached together, as shown in FIG. 4, the top PCB 114 is contained inside the heat spreader 100, and the bottom PCB 116 contacts the bottom edges of the side sections 104-110 of the heat spreader 100. The combined heat spreader 100 and PCBs 114 and 116 form a circuit board module 124 having multiple stacked PCBs and that may be incorporated in a larger system, such as a computer system or other appropriate electronic device. Connector pins 125 protruding from bottom PCB 116 (FIGS. 3 and 5) may connect to such a computer system.

The top PCB 114 generally includes a board 126 and a variety of different-height components 128, 129 (FIG. 5) and 130 (FIG. 4) mounted on the board 126. Although the top PCB 114 is shown having the components 128-130 only on one side, it is understood that the invention is not so limited, but that the top PCB 114 may also have components on the opposite side. Some of the components 128 and 129 are hidden from view by the heat spreader 100. Other components 130 protrude into and are visible in some of the holes 122 in the top section 102 of the heat spreader 100, because these components 130 are too tall for the top section 102 to cover. The top section 102 may be made thicker in order to cover these components 130 and, thereby, to enhance the EMI suppression benefits of the heat spreader 100. There may, however, be height constraints that limit the allowable thickness of the top section 102. The components 130 that may be exposed in this manner are generally those that do not have high heat dissipation requirements (i.e. consume relatively little power) and do not need to be in thermally conductive relationship with the heat spreader 100. Otherwise, these components 130 would also have to be covered by the heat spreader 100 or would have to be attached to an additional alternative heat dissipation device through the holes 122. Additionally, wires or cables 132 (e.g. power or communication lines) may connect to one of the PCBs (e.g. 114) through the heat spreader 100 (e.g. through side section 110).

For this example, it is assumed that the components 128 (FIG. 5) do not require the heat spreader 100 to dissipate heat from these components 128 and do not need to touch the interior surfaces of the recesses 120. The components 129, however, have heat dissipation requirements (i.e. consume a relatively large amount of power) that require the heat spreader 100 to be in thermally conductive relationship to these components 129 to efficiently transfer heat away from the components 129 to the top surface of the top section 102. In this case, therefore, the recesses 120 and/or other features on the interior side of the top section 102 are formed to generally match up with and contact the components 128. Where distance tolerances for mounting the components 129 on the top PCB 114 leave some uncertainty in whether the interior surfaces of the recesses 120 will actually touch the desired components 129, a gap filler (e.g. a thermal interface material, grease, etc.) may be placed between the interior surfaces of the recesses 120 and the components 129. Heat is thus transferred from the components 129 to the bottom surfaces of the recesses 120 and through the top section 102 of the heat spreader 100. Additional heat is transferred from the components 128, 129 and 130 through the board 126 to the side sections 104-110 of the heat spreader 100.

The bottom PCB 116 generally includes a board 134 and a variety of different-height components 136 and 138 (FIG. 5) mounted on the board 134. Although the bottom PCB 116 is shown having the components 136 and 138 only on one side, it is understood that the invention is not so limited, but that the bottom PCB 116 may also have components on the opposite side. In this example, it is assumed that the components 138 generally require a heat dissipation means, but that the components 136 do not necessarily require a heat dissipation means. The top PCB 114 generally has one or more holes 140 in the board 126 through which the projections 118 on the interior side of the top section 102 of the heat spreader 100 extend to the components 138 on the board 134. In this manner, the components 138 of the bottom PCB 116 can be in thermally conductive relationship with the heat spreader 100 through the top PCB 114. A heat dissipation means separate from the heat spreader 100, therefore, is not needed for the components 138 of the bottom PCB 116. Instead, most of the heat generated by the components 138 is transferred to the heat spreader 100 at the projections 118 bypassing the top PCB 114 through the holes 140 to the top section 102 of the heat spreader 100. Additionally, where distance tolerances for mounting the components 138 on the bottom PCB 114 leave some uncertainty in whether the bottom surfaces of the projections 118 will actually touch the desired components 138, a gap filler (e.g. a thermal interface material) may be placed between the projections 118 and the components 138 to fill any gap and enhance thermal conductivity between the projections 118 and the components 138. Furthermore, a mechanical gap filler, such as that described in U.S. Pat. No. 6,771,507 (the disclosure of which is incorporated as if fully set forth herein) with respect to "thermally-conductive pins," may be used when the thermal interface material alone is insufficient to fill the gap between the projections 118 and the components 138. Additional heat is transferred from the components 136 and 138 through the board 134 to the side sections 104-110 of the heat spreader 100.

Figure 5:
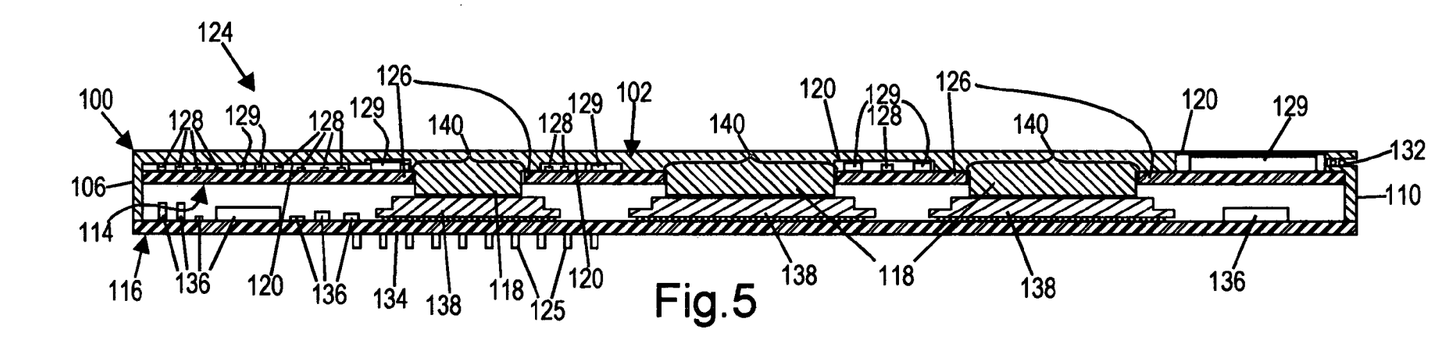
FIG. 5 is a cross sectional view of the circuit board module shown in FIG. 4 according to an embodiment of the present invention.
Figure 6:
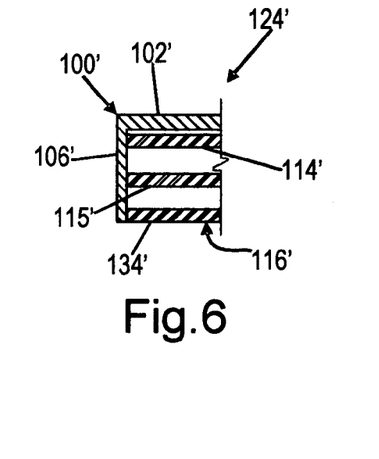
FIG. 6 is a partial cross sectional view of a portion of another circuit board module according to an alternative embodiment of the present invention.

The bottom edges of the side sections 104-110 of the heat spreader 100 may rest on the top surface of the board 134 of the bottom PCB 116, as shown in FIG. 5. Alternatively, as illustrated by a circuit board module 124' having a heat spreader 100', a top PCB 114' and a bottom PCB 116' as shown in FIG. 6, the bottom edges of side sections (e.g. 106') of the heat spreader 100' may surround the peripheral edges of a board 134' of the bottom PCB 116'. In this alternative, therefore, both PCBs 114' and 116' are contained in an interior of the heat spreader 100' defined by a top section 102', side section 106' and other side sections (not shown). FIG. 6 also shows another alternative embodiment which includes a third PCB 115' connected in a stacked configuration with and between the top and bottom PCBs 114' and 116' and contained within the interior of the heat snreader 100'. In each embodiment, since the heat spreader 100 (or 100') surrounds the components 128, 129, 136 and 138 of the PCBs 114 and 116 (or 114'. 115' and 116'), the heat spreader 100 (or 100') suppresses EMI from the components 128, 129,136 and 138 during operation of the PCBs 114 and 116 (or 114'. 115' and 116').

Figure 7:
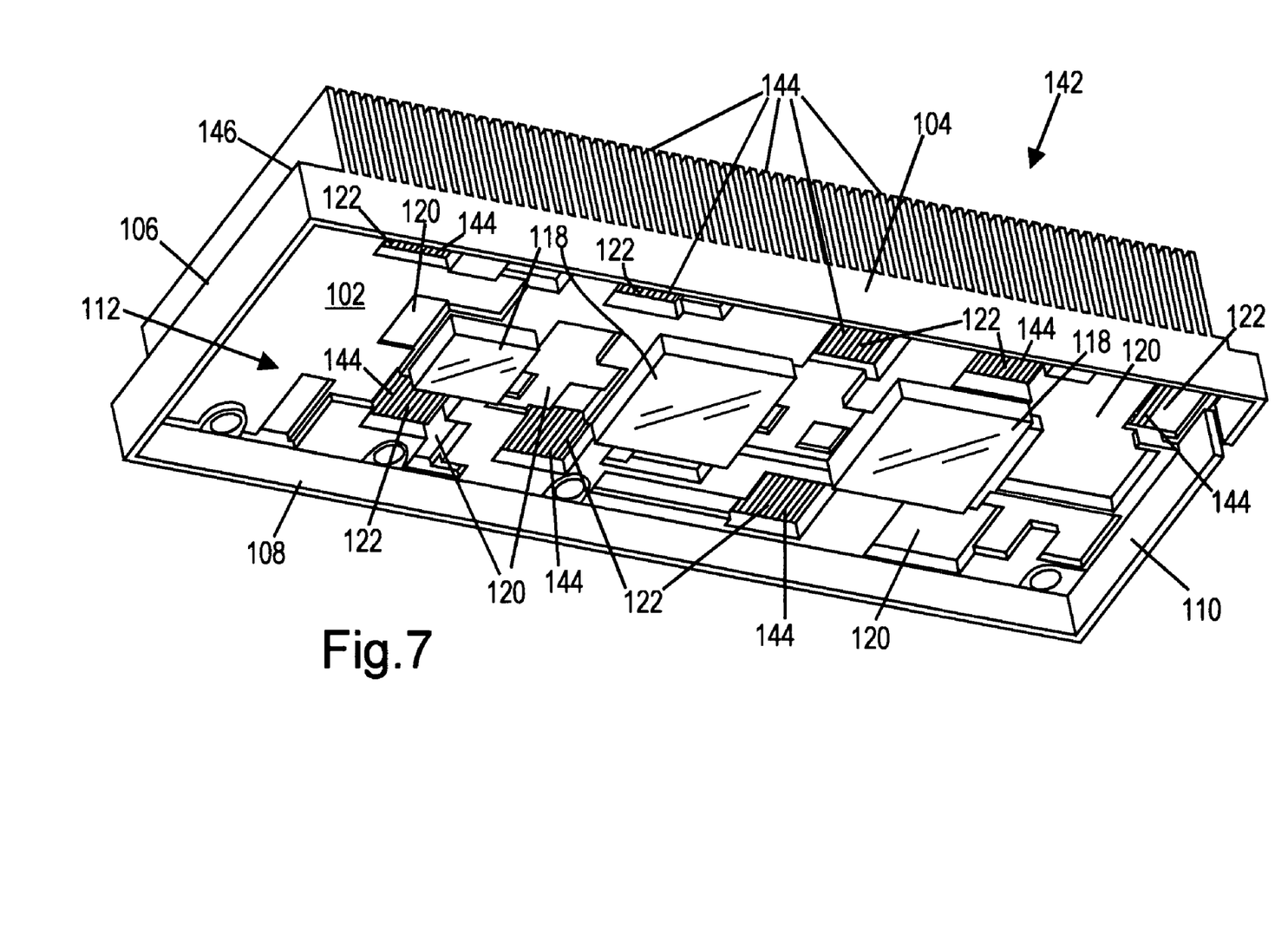
FIG. 7 is a bottom, front, left side perspective view of another heat spreader according to an alternative embodiment of the present invention.

According to an alternative embodiment, a heat spreader 142, as shown in FIG. 7, includes heat dissipation fins 144 protruding from and integral with a top section 146. Although the heat dissipation fins 144 are shown as straight fins, the heat dissipation fins 144 may be of any appropriate type or geometry like pin fins, angled, any fin known in the art. [Mention folded, airfoil, pin, square, any geometry elsewhere.] Other elements and features of the heat spreader 142 may be similar to those of the heat spreader 100 (FIGS. 1-5). Thus, the heat spreader 142 may be used with the PCBs 114 and 116 in the same manner as is the heat spreader 100, as described above, to form a circuit board module in which the heat spreader 142 transfers heat away from the heat-generating components of the PCBs 114 and 116. The heat dissipation fins 144 may be exposed through the holes 122, so the heat dissipation fins 144 may be in thermally conductive relationship with the exposed components 130 (FIG. 4) in order to transfer heat away from these components 130. Alternatively, if the top section 146 were made thicker in order to cover the components 130, then the heat dissipation fins 144 would not be exposed through the holes 122 and the EMI suppression benefits of the heat spreader 142 would be enhanced. However, minimum height constraints for the heat dissipation fins 144 and maximum available space in the overall computer system may constrain the thickness of the top section 146, making the holes 122 necessary. As a single integral device, the heat spreader 142 has an enhanced thermal performance over the heat spreader 100, which may have a separate heat sink attached to the top section 102 (FIGS. 1-5). The heat spreader 100, however, has a greater flexibility of usage, since any appropriate heat dissipation means (e.g. a heat sink, a heat pipe, a liquid cooled plate, etc.) may be attached to the top section 102.

The heat spreaders 100 and 142 may be formed in any appropriate manner. For example, the heat spreaders 100 and 142 may be cast, molded, cold forged, stamped, extruded, etc. Additionally, some of the features, such as recesses, hollowed out areas, openings or holes, on the heat spreaders 100 and 142 may be machined out of a single block of material having an initial size of approximately the general outer rectangular dimensions of the heat spreaders 100 and 142. Other features, such as projections, extensions or mechanical gap filler devices, may be attached to or mounted onto surfaces of the heat spreaders 100 and 142.

We claim:

1. A multiple stacked printed circuit board (PCB) module comprising:
   a first PCB having a variety of different-height components;
   a second PCB connected in a stacked configuration with the first PCB; and
   a heat spreader comprising:
   a top section having an interior side with a variety of projections and recesses; and
   side sections extending from the top section to bottom edges, the side sections and the interior side of the top section defining an interior of the heat spreader;
   and wherein:
   the interior of the heat spreader contains the first PCB therein with at least some of the projections and recesses of the top section conforming to and in thermal contact with at least some of the different-height components of the first PCB;
   the bottom edges of the side sections extend to the second PCB; and
   the heat spreader and second PCB substantially enclose the first PCB therein.

2. A multiple stacked PCB module as defined in claim 1 wherein:
   the heat spreader, upon operation of the first and second PCBs, suppresses electromagnetic interference generated by the first and second PCBs.

3. A multiple stacked PCB module as defined in claim 1 wherein:
   the second PCB comprises a board and at least one component mounted thereon; and
   the heat spreader is in thermally conductive relationship with the component on the board of the second PCB.

4. A multiple stacked PCB module as defined in claim 1 wherein:
   the first PCB comprises a board with the different-height components mounted thereon;
   the second PCB comprises a board and at least one component mounted thereon;
   the board of the first PCB comprises a hole through which the component mounted on the board of the second PCB is exposed to the interior side of the top section of the heat spreader; and
   at least one of the projections of the interior side of the top section of the heat spreader extends through the hole of the board of the first PCB to be in thermal contact with the component on the board of the second PCB.

5. A multiple stacked PCB module as defined in claim 1 wherein:
   the second PCB comprises at least one component mounted thereon;
   the first PCB comprises a hole therein; and
   the heat spreader is in thermally conductive relationship with the component on the second PCB through the hole in the first PCB.

6. A multiple stacked PCB module as defined in claim 1 wherein:
   the heat spreader further comprises heat dissipation fins projecting from a top side of the top section.

7. A multiple stacked PCB module as defined in claim 1 wherein:
   the heat spreader further comprises openings in a top side of the top section to expose at least one of the different-height components of the first PCB.

8. A multiple stacked PCB module as defined in claim 1 further comprising:
   a third PCB connected in a stacked configuration with the first and second PCBs;
   and wherein:
   the interior of the heat spreader contains the first and third PCBs therein; and
   the heat spreader and second PCB substantially enclose the first and third PCBs therein.

9. A heat spreader for use with multiple stacked printed circuit boards (PCBs) comprising:
   a top section having an interior side with a variety of projections and recesses; and
   side sections extending from the top section to bottom edges, the side sections and the interior side of the top section defining an interior of the heat spreader;
   and wherein:
   the interior substantially conforms to a first one of the PCBs to contain the first PCB substantially within the interior, the first PCB having a variety of different-height components;
   at least some of the projections and recesses of the top section conforming to and in thermal contact with at least some of the different-height components of the first PCB;

the bottom edges of the side sections substantially conform to edges of a second one of the PCBs stacked with the first PCB; and the heat spreader and second PCB, when connected together with the first PCB, substantially enclose the first PCB therein.

10. A heat spreader as defined in claim 9 wherein, when the heat spreader is connected together with the first and second PCBs, at least one of the projections of the interior side of the top section the interior projection passes through a hole in the first PCB to extend to a component on the second PCB.

11. A heat spreader as defined in claim 9 wherein:

the heat spreader, when connected together with the first and second PCBs and upon operation of the first and second PCBs, suppresses electromagnetic interference generated by the first and second PCBs.

12. A heat spreader as defined in claim 9 wherein:

the heat spreader is in thermally conductive relationship with a component of the second PCB.

13. A heat spreader as defined in claim 9 wherein:

at least one of the projections of the interior side of the top section of the heat spreader extends through a hole in the board of the first PCB to be in thermally conductive relationship with a component on a board of the second PCB when the heat spreader is connected together with the first and second PCBs.

14. A heat spreader as defined in claim 9 wherein:

the heat spreader is in thermally conductive relationship with a component on the second PCB through a hole in the first PCB.

15. A heat spreader as defined in claim 9 further comprising:

heat dissipation fins projecting from a top side of the top section.

16. A heat spreader as defined in claim 9 further comprising:

openings in a top side of the top section to expose at least one of different-height components of the first PCB when the heat spreader is connected to the first PCB.

17. A heat spreader as defined in claim 9 wherein:

the interior substantially conforms to the first one of the PCBs and to a third one of the PCBs, stacked with the first and second PCBs, to contain the first and third PCBs substantially within the interior; and the heat spreader and second PCB, when connected together with the first and third PCBs, substantially enclose the first and third PCBs therein.

18. A multiple stacked printed circuit board (PCB) module comprising:

three or more PCBs connected together in a stacked configuration; and a heat spreader comprising:

a top section having an interior side with a variety of projections and recesses; and side sections extending from the top section to bottom edges, the side sections and the interior side of the top section defining an interior of the heat spreader;

and wherein:

the interior of the heat spreader contains a plurality of the PCBs therein, one of which has a variety of different-height components, and at least some of the projections and recesses of the top section conform to and are in thermal contact with at least some of the different-height components;

the bottom edges of the side sections extend to at least one of the PCBs; and the heat spreader and the at least one of the PCBs substantially enclose the plurality of the PCBs therein.

* * * * *

UNITED STATES PATENT AND TRADEMARK OFFICE
CERTIFICATE OF CORRECTION

PATENT NO. : 7,345,885 B2
APPLICATION NO. : 11/023213
DATED : March 18, 2008
INVENTOR(S) : Brent A. Boudreaux et al.

It is certified that error appears in the above-identified patent and that said Letters Patent is hereby corrected as shown below:

In column 4, line 61, delete "snreader" and insert -- spreader --, therefor.

In column 6, line 15, in Claim 4, delete "thereon:" and insert -- thereon; --, therefor.

In column 7, line 10, in Claim 10, after "section" delete "the interior projection".

Signed and Sealed this

Twelfth Day of August, 2008

JON W. DUDAS
*Director of the United States Patent and Trademark Office*